(12) United States Patent
Vulovic et al.

(10) Patent No.: US 8,143,880 B2
(45) Date of Patent: Mar. 27, 2012

(54) DUAL-RANGE MEASUREMENT OF ELECTRICAL CURRENT

(75) Inventors: Marko Vulovic, Columbia, NJ (US); Peyman Safa, Hopatcong, NJ (US); Benjamin D. Hoover, Fort Collins, CO (US); Daniel R. Schwartz, North Bergen, NJ (US)

(73) Assignee: Agilent Technologies, Inc., Santa Clara, CA (US)

( * ) Notice: Subject to any disclaimer, the term of this patent is extended or adjusted under 35 U.S.C. 154(b) by 251 days.

(21) Appl. No.: 12/533,938

(22) Filed: Jul. 31, 2009

(65) Prior Publication Data

US 2011/0025299 A1    Feb. 3, 2011

(51) Int. Cl.
*G01R 1/38* (2006.01)
*G01R 17/00* (2006.01)
*G01R 31/08* (2006.01)

(52) U.S. Cl. .................. 324/115; 324/123 C; 324/523

(58) Field of Classification Search .............. 324/115, 324/123, 509, 512, 522, 523, 543, 535; 318/632; 330/282
See application file for complete search history.

(56) References Cited

U.S. PATENT DOCUMENTS

| 5,451,904 A * | 9/1995 | Terada et al. ............. 330/282 |
| 6,043,623 A * | 3/2000 | McCary .................... 318/632 |
| 6,603,301 B2 * | 8/2003 | Benes ...................... 324/115 |

* cited by examiner

*Primary Examiner* — Huy Q Phan
*Assistant Examiner* — Tung X Nguyen

(57) ABSTRACT

An electrical current measurement system. A sense impedance and a composite amplifier are in electrical communication and together define a trans-impedance circuit that presents a frequency-compensated impedance lower than the sense impedance to an input electrical current to be measured. A sense amplifier in electrical communication with the sense impedance provides an output indicative of a magnitude of the input electrical current. A current bypass circuit may parallel the trans-impedance circuit and bypass the input electrical current around the trans-impedance circuit when the current reaches a predefined magnitude. The system may be combined with another current sensor to form a dual-range current measurement instrument.

20 Claims, 3 Drawing Sheets

DUAL-RANGE MEASUREMENT OF ELECTRICAL CURRENT

BACKGROUND

A dual-range electrical current measurement system is described in U.S. Pat. No. 6,603,301 (issued to Michael Benes and assigned to the assignee of the present application) the entire contents of which are incorporated herein by this reference. That patent represented a significant improvement over what was then the prior art as depicted in FIGS. 1 and 2 thereof. Referring to FIG. 4 thereof, a dual-range current measurement system includes a high-current sensor $R_H$ with an associated sense amplifier and a low-current sensor included within a 2-stage amplifier network. This network includes a bipolar current bypass consisting of FETs $Q_1$ and $Q_2$ that together shunt the current being measured to ground when that current exceeds the range of the low-current sensor.

There has been a need for a stable, high-bandwidth dual-range current measurement system that engages a bypass very rapidly when switching to a higher range and settles very rapidly when switching to a lower range.

SUMMARY OF THE INVENTION

In one aspect, the invention resides in an electrical current measurement system having a sense impedance and a composite amplifier in electrical communication with the sense impedance. The sense impedance and the composite amplifier, which may be connected in series, together define a trans-impedance circuit. The trans-impedance circuit presents a frequency-compensated impedance lower than the sense impedance to an input electrical current to be measured. A sense amplifier provides an output indicative of a magnitude of the input electrical current flowing through the sense impedance. A current bypass circuit in parallel with trans-impedance circuit bypasses the input electrical current through a bypass path around the trans-impedance circuit when the current reaches a predefined magnitude.

In another aspect, the invention resides in a dual-range current measurement system including a current measurement system similar to the foregoing and in series therewith a high-current sense impedance with a high-range sense amplifier that provides an output indicative of a magnitude of the electrical current within a relatively high range of values.

DESCRIPTION OF THE EMBODIMENTS

Embodiments of the invention will be described in the context of a dual-range current measurement system. In other embodiments of the invention, a single-range current measurement system omits the high-range elements described below.

Figure 1:
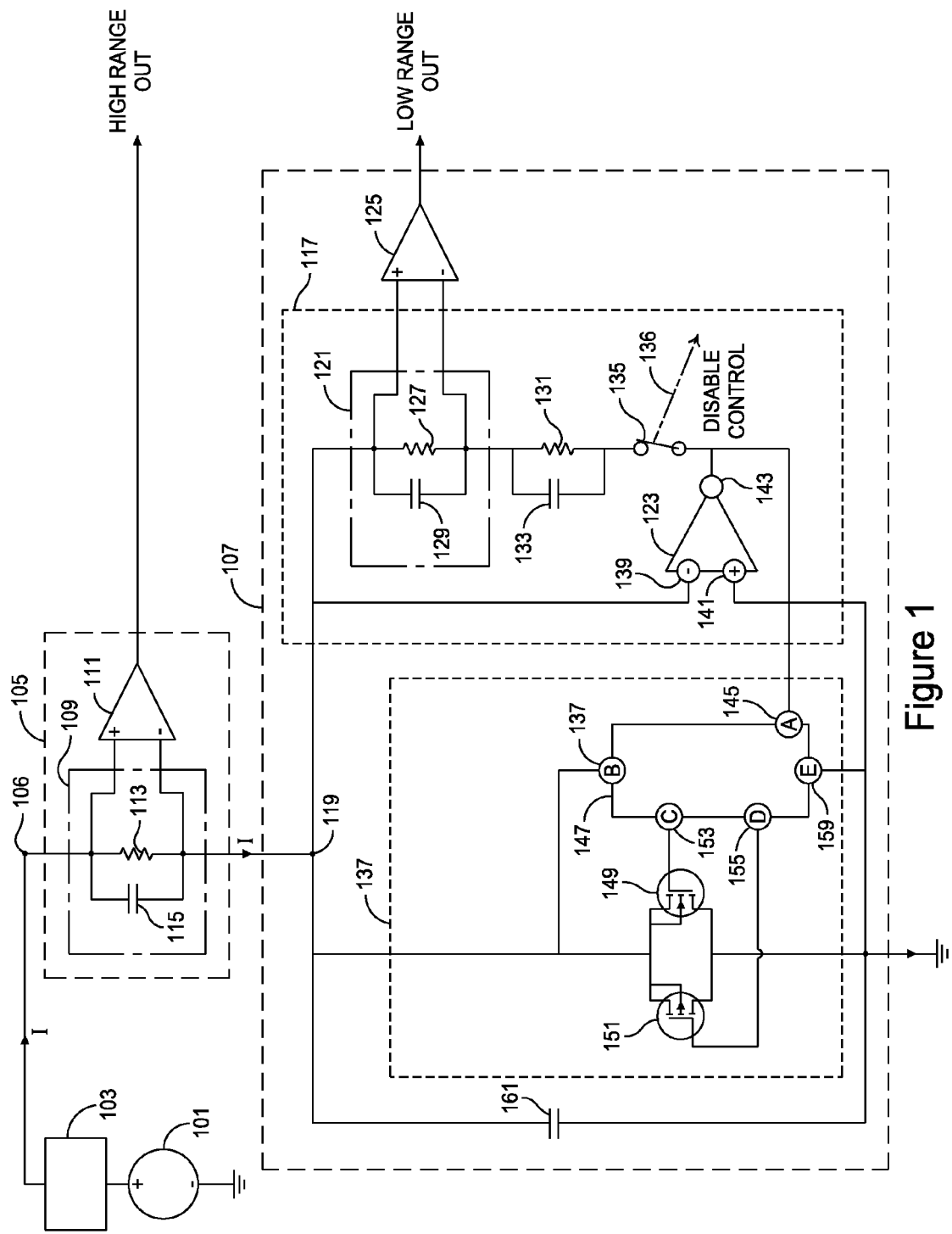
FIG. 1 is a partial block diagram and partial schematic diagram of a dual-range current measurement system embodying the invention.

FIG. 1 depicts a power supply 101 and a load 103 in series with a dual-range current measurement system according to an embodiment of the invention. The system includes a high-range measurement unit 105 and a low-range measurement unit 107 in series connection such that an electrical current I provided by the power supply flows through the load and into the high-range measurement unit 105 at a node 106, and from there into the low-range measurement unit 107 at a node 119. The high-range unit 105 has a high-current sense impedance 109 connected to receive the electrical current. A high-range sense amplifier 111 is in electrical communication with the impedance 109 and provides an output voltage indicative of a magnitude of the electrical current within a high range of current values.

The high-current sense impedance 109 includes a resistor 113 and a capacitor 115 in parallel connection. The capacitor keeps the insertion impedance low at high frequencies and limits the bandwidth of the full-range electrical current to prevent the high-range sense amplifier 111 from going into slew limit. The capacitor also helps to assure a smooth roll-off of the measurement transfer function.

The high-range sense amplifier may be a stable controlled-gain instrumentation amplifier.

In the low-range measurement unit 107, a trans-impedance circuit 117 is connected to receive the electrical current I at the node 119. The trans-impedance circuit includes a low-current sense impedance 121 and a composite amplifier circuit 123.

A low-range sense amplifier 125 is in electrical communication with the low-current sense impedance 121 and provides an output voltage indicative of a magnitude of the portion of current I flowing into the trans-impedance circuit 117.

The low-current sense impedance 121 includes a resistor 127 and a capacitor 129 in parallel connection. The capacitor 129 functions similarly to the capacitor 115 in the high-current sense impedance.

A parallel combination of a resistor 131 and a capacitor 133 is connected in series with the low-current sense impedance 121. These components allow control of the full-scale voltage at the output of the low-range sense amplifier 125 and facilitate accurate clamping of the amplifier 125. These parts are not strictly necessary and may be omitted in an alternate embodiment.

In turn, a first terminal of a normally-closed switch 135 is connected to this parallel combination. The switch 135 may be implemented as an analog switch, a relay, a mechanical switch, or some other switching device as desired. The switch 135 interrupts current flow through the low-current sense impedance 121 when switched to its open position under the influence of a disable control signal 136 or, in case of a mechanical switch, by manual activation.

The low-range sense amplifier 125 may be a stable controlled-gain instrumentation amplifier similar to the high-range sense amplifier 111.

A negative input 139 of the composite amplifier circuit 123 is connected to the node 119 and a positive input 141 of the circuit 123 is connected to ground. An output 143 of the circuit 123 and a second terminal of the switch 135 are connected to an input 145 of a bypass control circuit 147.

The current bypass circuit 137 receives the current I from the node 119 and operates to conduct the excess portion of current I around the trans-impedance circuit when the current exceeds the low range of values.

The current bypass circuit 137 includes a P-type field-effect MOS transistor (PMOSFET) 151 and an NMOSFET 149 in a complementary parallel connection through which the current I flows when the current bypass circuit is active. The bypass control circuit 147 activates one or the other of these transistors, depending on the polarity of the current I, whenever the current exceeds the low range of values. An output 155 of the bypass control circuit 147 is connected to a source of the PMOSFET 151 and an output 153 of the bypass control circuit 147 is connected to a source of the NMOSFET 149. An input 137 of the bypass control circuit 147 is connected to the node 119. A terminal 159 of the bypass control circuit 147 is connected to ground.

A bypass capacitor 161 parallels the current bypass circuit 137 between the node 119 and ground. This capacitor reduces the insertion impedance of the trans-impedance circuit 117 at frequencies above the desired measurement bandwidth.

Figure 2:
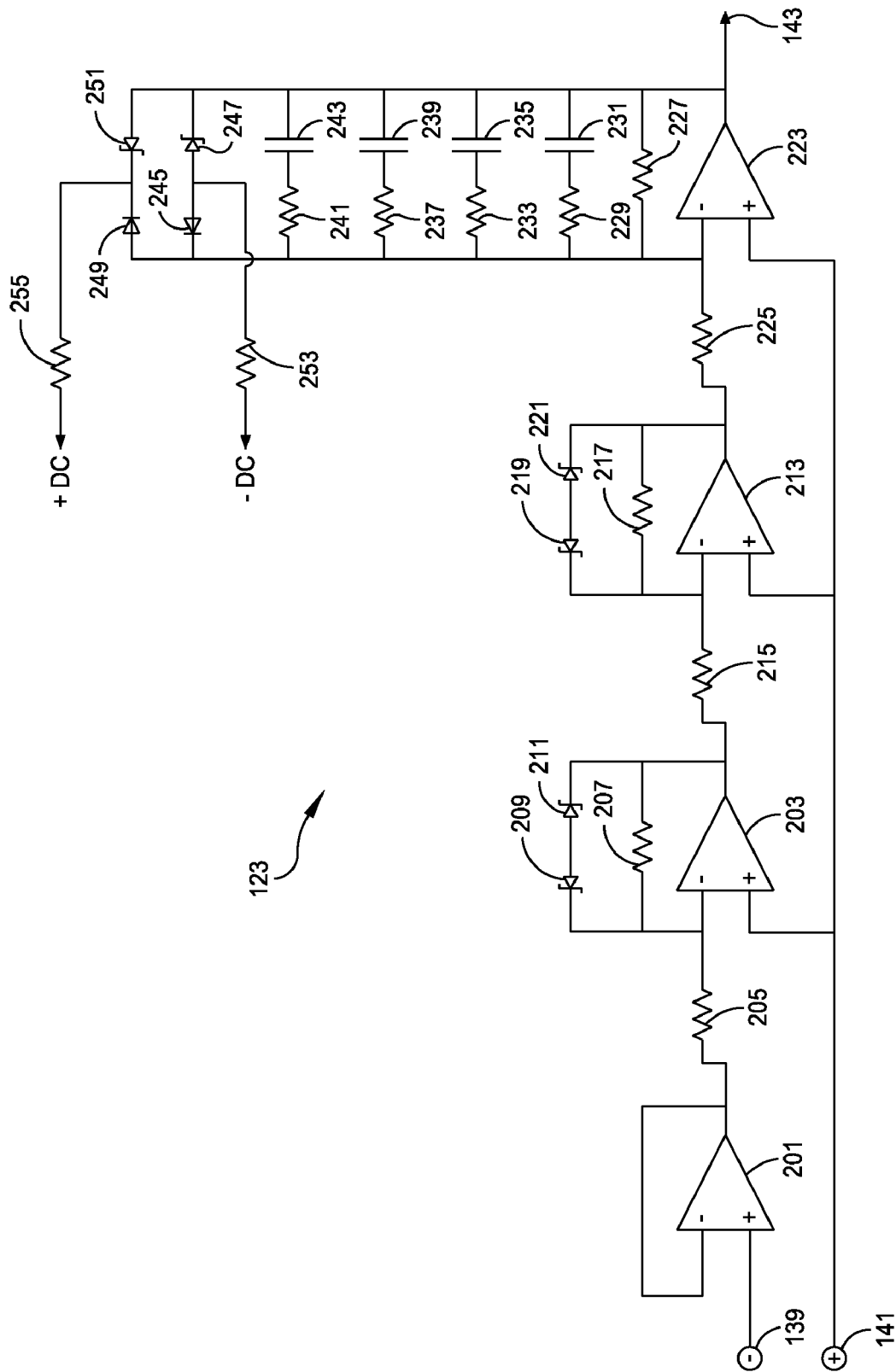
FIG. 2 is a schematic diagram of a composite amplifier circuit used in the trans-impedance circuit of the system of FIG. 1.

Turning now to FIG. 2, the composite amplifier circuit 123 actively regulates the voltage appearing between its negative and positive terminals 139 and 141 to be equal. The circuit 123 is frequency-compensated to cause the trans-impedance circuit 117 to present a lower impedance than that of the low-current sense impedance alone when observed from node 119. The circuit includes four amplification stages to achieve the required gain-bandwidth although in some embodiments more or fewer may be used as desired. The circuit may simulate an inductive load over some or all of its frequency range, depending on selection of specific component values.

A first amplifier 201 is connected in a unity-gain buffer configuration with its negative input connected to its output and its positive input serving as the negative input 139 of the overall composite amplifier circuit. An output of the amplifier 201 is connected to a negative input of a second amplifier 203 through a resistor 205. A resistor 207 in parallel with anode-to-anode Zener clamping diodes 209 and 211 provides feedback from an output of the amplifier 203 back to the negative input. The output of the amplifier 203 is connected to a negative input of a third amplifier 213 through a resistor 215. A resistor 217 in parallel with anode-to-anode clamping Zener diodes 219 and 221 provides feedback from an output of the amplifier 213 back to the negative input. The output of the amplifier 213 is connected to a negative input of a fourth amplifier 223 through a resistor 225.

An output of the fourth amplifier 223 provides the output 143 of the composite amplifier. Positive inputs of the amplifiers 203, 213 and 223 are connected together to provide the positive input 141 of the composite amplifier.

In some embodiments, the analog switch 135 provides additional series resistance that helps prevent local instability of the last amplifier 223. If the switch 135 is implemented as a mechanical switch, an additional series resistance may be provided to accomplish this. The amplifier 223 has a feedback circuit between its negative input and its output. This feedback circuit includes the following in parallel: a resistor 227; a resistor 229 in series with a capacitor 231; a resistor 233 in series with a capacitor 235; a resistor 237 in series with a capacitor 239; a resistor 241 in series with a capacitor 243; a diode 245 anode-to-anode in series with a Zener diode 247; and a diode 249 cathode-to-cathode in series with a Zener diode 251.

The anode-to-anode connection of the diode 245 and the Zener diode 247 is connected to a negative power supply point through a resistor 253. The cathode-to-cathode connection of the diode 249 and the Zener diode 251 is connected to a positive power supply point through a resistor 255.

The clamping Zener diodes in the feedback circuits of the amplifiers 203 and 213, and the diodes in the feedback circuit of the amplifier 223, prevent amplifier saturation and improve speed when switching to low range. The configuration of the clamp circuits in this embodiment is only one of many possible configurations that have a similar effect.

The composite amplifier circuit is compensated by the above-described components to create a roll-off of 10 dB per decade. Depending on component values, this compensation may cause the insertion impedance of the trans-impedance circuit 117 to appear as an inductor with 45 degrees of phase lag. This stabilizes the trans-impedance circuit 117 regardless of the amount of capacitance in load 103. In some embodiments more or fewer parallel resistor-capacitor pairs, or other combinations of components in addition to, or in place of, the above-described components, may be used to create a similar effect as desired. In other embodiments the active frequency compensation provided by the composite amplifier circuit may reduce the impedance presented by the trans-impedance circuit to a suitably low lever, less than that of the low-current sense impedance, without causing the impedance looking into the source to appear inductive.

Figure 3:
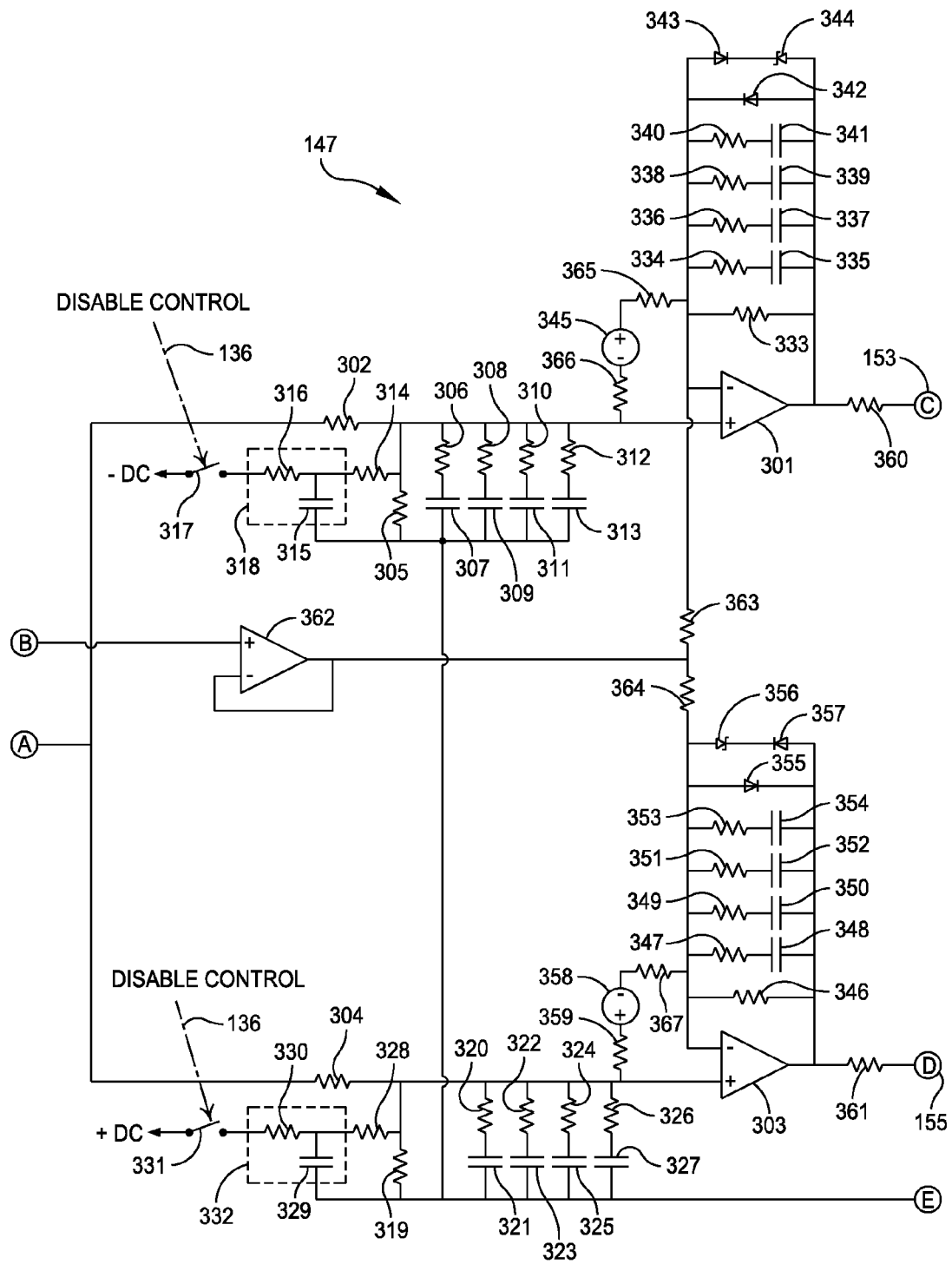
FIG. 3 is a schematic diagram of a bypass control circuit used in the current bypass circuit of the system of FIG. 1.

The bypass control circuit 147 is depicted in FIG. 3. The input 145 is connected to a positive input of an amplifier 301 through a resistor 302 and to a positive input of an amplifier 303 through a resistor 304. The positive input of the amplifier 301 is connected to ground through the output 159 and a parallel connection of the following: a resistor 305; a resistor 306 and a capacitor 307 in series; a resistor 308 and a capacitor 309 in series; a resistor 301 and a capacitor 311 in series; a resistor 312 and a capacitor 313 in series; and a resistor 314 and a capacitor 315 in series. A resistor 316 is connected between a normally-open analog switch 317 and a junction of the resistor 316 and the capacitor 315. The resistor 316 and the capacitor 315 together form an RC divider 318.

The positive input of the amplifier 303 is connected to ground through the output 159 and a parallel connection of the following: a resistor 319; a resistor 320 and a capacitor 321 in series; a resistor 322 and a capacitor 323 in series; a resistor 324 and a capacitor 325 in series; a resistor 326 and a capacitor 327 in series; and a resistor 328 and a capacitor 329 in series. A resistor 330 is connected between a normally-open analog switch 331 and a junction of the resistor 328 and the capacitor 329. The resistor 330 and the capacitor 329 together form an RC divider 332.

A negative input of the amplifier 301 is connected to the output of the amplifier 301 through a feedback network that includes the following in parallel: a resistor 333; a resistor 334 and a capacitor 335 in series; a resistor 336 and a capacitor 337 in series; a resistor 338 and a capacitor 339 in series; a resistor 340 and a capacitor 341 in series; a diode 342 with cathode connected to the negative input; and a diode 343 and a Zener diode 344 in cathode-to-cathode series connection. A positive end of a DC bias source 345 is connected to the negative input of the amplifier 301 through a resistor 365, and a negative end of the source 345 is connected to the positive input of the amplifier 301 through a resistor 366.

A negative input of the amplifier 303 is connected to the output of the amplifier 303 through a feedback network that includes the following in parallel: a resistor 346; a resistor 347 and a capacitor 348 in series; a resistor 349 and a capacitor 350 in series; a resistor 351 and a capacitor 352 in series; a resistor 353 and a capacitor 354 in series; a diode 355 with anode connected to the negative input; and a diode 356 and a Zener diode 357 in cathode-to-cathode series connection. A negative end of a DC bias source 358 is connected to the negative input of the amplifier 303 through a resistor 367, and a negative end of the source 358 is connected to the positive input of the amplifier 303 through a resistor 359.

The output of the amplifier 301 connects to the output 153 of the bypass control circuit through a resistor 360. The output of the amplifier 303 connects to the output 155 of the bypass control circuit through a resistor 361.

An amplifier 362 is configured as a unity-gain buffer and has a positive input that serves as the bypass control circuit input 157. An output of the amplifier 362 is connected to a negative input of the amplifier 362. The output of the amplifier 362 is connected to the negative input of the amplifier 301 through a resistor 363 and to the negative input of the amplifier 303 through a resistor 364.

The bias sources 345 and 358 and their associated resistors determine a threshold. Whenever the magnitude of the current flow into (or out of) the trans-impedance circuit exceeds this threshold, one or the other of the FETs 149 and 151 is activated to bypass the current around the trans-impedance circuit to ground. As the current passes that threshold, one of the amplifiers 301 and 303 begins to actively regulate the voltage on the source of the connected FET to nearly zero, eventually driving the FET into saturation if current I reaches a high enough level. At that point, the insertion impedance of the low-range unit 107 becomes the parallel combination of the saturated FET and the bypass capacitor 161. The process reverses as the current decreases and falls below the threshold. The switches 317 and 331 (when closed) and 135 (when open) force all current to bypass the trans-impedance circuit 117, in effect disabling the low range unit 107. The RC dividers 318 and 332 prevent this forced bypassing from happening so abruptly as to disrupt the output voltage seen by the load 103 on the node 106.

Amplifiers 301 and 303 are compensated to create a roll-off of 10 dB per decade. As discussed above, this compensation may cause the impedance looking into the source terminal of FETs 151 and 149 to appear as an inductor with 45 degrees of phase lag when the threshold is exceeded, but before the FET saturates. This stabilizes amplifiers 301 and 303 regardless of the amount of capacitance in load 103. In some embodiments more or fewer parallel resistor-capacitor pairs, or other combinations of components in addition to, or in place of, the above-described components, may be used to create a similar effect as desired. In other embodiments the active frequency compensation provided by these amplifiers may reduce the impedance presented by the trans-impedance circuit to a suitably low lever, less than that of the low-current sense impedance, without causing the impedance looking into the source to appear inductive.

Due to parasitic offset errors in the system, for example the input offset voltage of the amplifier 201, the trans-impedance circuit 117 does not regulate the voltages across the FETs 149 and 151 to exactly zero. This could create a situation in which, at the threshold current value, the voltage across the FET would be opposite in polarity to that which would be expected with a positive insertion impedance, causing the small-signal gain of the FET from $V_{gs}$ to $I_d$ to reverse polarity. Such a polarity reversal would in turn create positive feedback at DC, resulting in latch-up of the FET and bypass control circuit.

The DC insertion impedance of the trans-impedance circuit 117 is roughly equal to the quotient of the DC feedback resistance of the composite amplifier 123 over the open-loop DC gain of the composite amplifier 123. To prevent latch-up, the DC insertion impedance must be large enough to ensure that the voltage developed at the node 119 at the threshold current exceeds the sum of the worst-case DC offset errors from all sources.

The compensation provided by the composite amplifier circuit allows unrestrained capacitive loading without destabilization. The rapid FET bypass switching and the lack of gate-source FET compensation provide low charge injection and correspondingly short settling times. The low bypass capacitance and high bandwidth of the composite amplifier circuit provide a capability of current measurement over a wide range of frequencies. The bypass control circuit engages the FETs very rapidly, resulting in low voltage glitches when changing range in response to rapid input current fluctuations. High accuracy is provided by the effect of the differential low-range sense amplifier 125 in removing any voltage offset from the composite amplifier.

Although certain embodiments have been described and illustrated, various modifications and changes may be made without departing from the scope of the invention. Accordingly, the invention is to be limited only by the claims.

The invention claimed is:

1. An electrical current measurement system comprising:
a sense impedance;
a composite amplifier in electrical communication with the sense impedance, the sense impedance and the composite amplifier together defining a trans-impedance circuit operative to present a frequency-compensated impedance to an input electrical current to be measured, the frequency-compensated impedance being lower than the sense impedance; and
a sense amplifier in electrical communication with the sense impedance and operative to provide an output indicative of a magnitude of the input electrical current.

2. A system as in claim 1 wherein the sense impedance and the composite amplifier are in a series configuration.

3. A system as in claim 1 wherein the frequency-compensated impedance simulates an inductive load over at least a portion of its frequency range.

4. A system as in claim 1 wherein the sense impedance comprises a resistor and a capacitor in a parallel configuration.

5. A system as in claim 1 wherein the sense amplifier comprises an instrumentation amplifier.

6. A system as in claim 1 and further comprising a bypass capacitor in parallel with the trans-impedance circuit.

7. An electrical current measurement system comprising:
a sense impedance;
a composite amplifier in electrical communication with the sense impedance, the sense impedance and the composite amplifier together defining a trans-impedance circuit operative to present a frequency-compensated impedance to an input electrical current to be measured, the frequency-compensated impedance being lower than the sense impedance;
a sense amplifier in electrical communication with the sense impedance and operative to provide an output indicative of a magnitude of the input electrical current; and
a current bypass circuit in parallel connection with and responsive to the trans-impedance circuit to bypass the input electrical current through a bypass path around the trans-impedance circuit when the current reaches a predefined magnitude.

8. A system as in claim 7 wherein the bypass path comprises complementary field effect transistors in a parallel configuration.

9. A system as in claim 7 and further comprising a switching element operative when activated to disable the trans-impedance circuit.

10. A system as in claim 9 wherein the switching element comprises a normally-closed switch in series connection with the sense impedance.

11. A system as in claim 9 wherein the current bypass circuit comprises a timing circuit and wherein the switching element is operative when activated to apply a bias to the current bypass circuit through the timing circuit and thereby activate the current bypass circuit at a controlled rate.

12. A dual-range current measurement system comprising:
a high-current sense impedance connected to receive an electrical current to be measured;
a high-range sense amplifier, in electrical communication with the high-current sense impedance and operative to provide an output indicative of a magnitude of the electrical current within a relatively high range of values;
a trans-impedance circuit connected to receive the electrical current, the trans-impedance circuit including a low-current sense impedance and a composite amplifier in electrical communication, the trans-impedance circuit operative to present a frequency-compensated impedance to the electrical current, the frequency-compensated impedance being lower than the sense impedance;
a low-range sense amplifier, in electrical communication with the low-current sense impedance and operative to provide an output indicative of a magnitude of the electrical current within a relatively low range of values; and
a current bypass circuit in parallel connection with the trans-impedance circuit, operative to conduct the electrical current when the current exceeds the low range of values.

13. A system as in claim 12 wherein the sense impedance and the composite amplifier are in a series configuration.

14. A system as in claim 12 wherein the frequency-compensated impedance simulates an inductive load over at least a portion of its frequency range.

15. A system as in claim 12 wherein the high-current sense impedance comprises a resistor and a capacitor in parallel connection and the low-current sense impedance comprises a resistor and a capacitor in parallel connection.

16. A system as in claim 12 wherein the current bypass circuit comprises complementary field effect transistors in a parallel configuration.

17. A system as in claim 12 wherein each sense amplifier comprises an instrumentation amplifier.

18. A system as in claim 12 and further comprising a switching element operative when activated to disable the trans-impedance circuit, the switching element comprising a normally-closed switch in series connection with a current path through the low-range sense impedance.

19. A system as in claim 12 wherein the current bypass circuit comprises a timing circuit and further comprising a switching element operative when activated to apply a bias to the current bypass circuit through the timing circuit and thereby activate the current bypass circuit at a controlled rate.

20. A system as in claim 12 and further comprising a bypass capacitor in parallel with the trans-impedance circuit and the current bypass circuit.

* * * * *